(12) United States Patent
Strouse et al.

(10) Patent No.: US 8,663,491 B1
(45) Date of Patent: Mar. 4, 2014

(54) ION ETCHING OF GROWING INP NANOCRYSTALS USING MICROWAVE

(71) Applicant: The Florida State University Research Foundation, Inc., Tallahassee, FL (US)

(72) Inventors: Geoffrey F. Strouse, Tallahassee, FL (US); Derek D. Lovingood, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 22 days.

(21) Appl. No.: 13/645,888

(22) Filed: Oct. 5, 2012

Related U.S. Application Data

(63) Continuation of application No. 12/201,589, filed on Aug. 29, 2008, now Pat. No. 8,357,308.

(60) Provisional application No. 61/079,478, filed on Jul. 10, 2008.

(51) Int. Cl.
*C03C 15/00* (2006.01)

(52) U.S. Cl.
USPC .................. 216/100; 216/37; 216/66; 257/9; 117/4

(58) Field of Classification Search
USPC ..................... 216/37, 66, 100; 257/9; 117/4
See application file for complete search history.

(56) References Cited

U.S. PATENT DOCUMENTS

| | | |
|---|---|---|
| 6,306,610 B1 | 10/2001 | Bawendi et al. |
| 7,655,479 B2 | 2/2010 | Zhukov et al. |
| 2006/0060998 A1 | 3/2006 | Strouse et al. |

OTHER PUBLICATIONS

Gerbec, J.A., Magana, D., Washington, A., and Strouse, G.F. 2005. "Microwave-Enhanced Reaction Rates for Nanoparticle Synthesis." J. Am. Chem. Soc. vol. 127, pp. 15791-15800.
Borkovska, et al.; "Effect of Conjugation with Biomolecules on Photoluminescence and Structural Characteristics of CdSe/ZnS Quantum Dots"; Semiconductors, vol. 43, No. 6, pp. 775-781, 2009.
Ngo, et al.; "Thermal Properties of Imidazolium Ionic Liquids"; Thermochimica Acta, vol. 357-358, pp. 97-102, 2000.
Dictionary.Com, "Catalyst—Define Catalyst at Dictionary.com"; http://dictionary.reference.com/browse/catalyst, Accessed on Jul. 18, 2012.
Answers.Com; "Electron-hole recombination: Definition from Answers.com"; http://www.answers.com/topic/electron-hole-recombination; Accessed on Jun. 8, 2012.

*Primary Examiner* — Lan Vinh
*Assistant Examiner* — Maki Angadi
(74) *Attorney, Agent, or Firm* — Robert J. Varkonyi; Anton J. Hopen; Smith & Hopen, P.A.

(57) ABSTRACT

High quantum yield InP nanocrystals are used in the biotechnology, bio-medical, and photovoltaic, specifically IV, III-V and III-VI nanocrystal technological applications. InP nanocrystals typically require post-generation HF treatment. Combining microwave methodologies with the presence of a fluorinated ionic liquid allows Fluorine ion etching without the hazards accompanying HF. Growing the InP nanocrystals in the presence of the ionic liquid allows in-situ etching to be achieved. The optimization of the PL QY is achieved by balancing growth and etching rates in the reaction.

20 Claims, 7 Drawing Sheets

ION ETCHING OF GROWING INP NANOCRYSTALS USING MICROWAVE

CROSS REFERENCE TO RELATED APPLICATION

This application is a continuation of U.S. application Ser. No. 12/201,589, entitled "Ion Etching of Growing InP Nanocrystals using Microwave", filed Aug. 29, 2008, which claims priority to U.S. Provisional Patent Application No. 61/079,478, entitled "Microwave Etching of Semiconductor Nanoparticles", filed on Jul. 10, 2008, the contents of which are herein incorporated by reference.

STATEMENT OF GOVERNMENT INTEREST

This invention was made with Government support under Grant No. EB-R01-00832 awarded by the National Institutes of Health and Grant No. DMR-0701462 awarded by the National Science Foundation. The Government has certain rights in the invention.

FIELD OF INVENTION

This invention relates to nanocrystal generation. Specifically, the invention provides a novel method of generating nanocrystals with enhanced photoluminescent characteristics.

BACKGROUND OF THE INVENTION

Over the past decade, numerous advances have been made in the synthetic procedures for formation and isolation of high quality inorganic nanoparticles. The size dependent optical properties of colloidal semiconductor nanocrystals are ideal for applications in fields ranging from biological imaging, photovoltaics optoelectronic devices, biological tagging, optical switching, solid-state lighting, and solar cell applications. (Chan, W.; Nie, S. *Science*. 1998, 281, 2016-2018; Bruchez, J.; Moronne, M.; Gin, P.; Weiss, S.; Alivisatos, A. *Science*. 1998, 281, 2013-2016; Bharali, D. J.; Lucey, D. W.; Jayakumar, H.; Pudavar, H. E.; Prasad, P. N. *Journal of American Chemistry Society*. 2005, 127, 11364-113671; Huynh, W.; Dittmer, J.; Alivisatos, A. *Science*. 2002, 295, 2425-2427; Sun, B.; Marx, E.; Greenham, N. *Nano Letters*. 2003, 3, 961-963; Gur, I.; Fromer, N.; Chen, C.; Kanaras, A.; Alivisatos, A. *Nano Letters*. 2007, 7, 409-414). Due to the ease of synthesis, a significant fraction of the research to date has centered on the II-VI family of semiconductors utilizing the type I core-shell structures, namely CdSe/ZnS (Park, J.; Joo, J.; Kwon, S.; Jong, Y.; Hyeon, T. *Angew. Chem. Int. Ed.* 2007, 46, 4630-4660; Embden, J.; Jasieniak, J.; Gomez, D.; Mulvaney, P.; Giersig, M. *Aust. J. Chem.* 2007, 60, 457-471). Recent interest has focused on developing routes to the III-V family, namely InP (Xie, R.; Battaglia, D.; Peng, X. *Journal of American Chemistry Society*. 2007, 129, 15432-15433; Gerbec, J.; Magana, D.; Washington, A.; Strouse, G. *Journal of American Chemistry Society*. 2005, 127, 15791; Adam, S.; Talapin, D.; Borchert, H.; Lobo, A.; McGinley, C.; de Castro, A.; Hasse, M.; Weller, H.; Möller, T. *The Journal of Chemical Physics*. 2005, 123, 084706; Borchert, H.; Haubold, S.; Haase, M.; Weller, H.; McGinley, C.; Riedler, M.; Moller, T. *Nano Letters*. 2002, 2, 151-154), due to the perceived lower toxicity for InP based nanocrystals (Bharali, D. J.; et al., *Journal of American Chemistry Society*. 2005, 127, 11364-113671; Xie, R.; et al., *Journal of American Chemistry Society*. 2007, 129, 15432-15433; Oda, K. *Industrial Health*. 1997, 35, 61-68; Zheng, W.; Winter, S. M.; Kattnig, M. J.; Carter, D. E.; Sipes, I. G. *J Toxicol Environ Health*. 1994, 43, 483-494; Kabe, I.; Kazuyuki, O.; Hiroshi, N.; Nomiyama, T.; Uemura, T.; Hosoda, K.; Ishizuka, C.; Yamazaki, K.; Sakurai, H. *Journal of Occupational Health*. 1996, 38, 6-12; Yamazk, I.; Tanaka, A.; Hirata, M.; Omura, M.; Makita, Y.; Inoue, N.; Sugio, K.; Sugimachi, K., *Journal of Occupational Health*. 2000, 42, 169-178). The downside to InP is the poor photoluminescence (PL) quantum yield (QY), which is typically <4% once isolated from the reaction mixture, although core-shelling yields a value of ~20% depending on size (Borchert, H.; et al., *Nano Letters*. 2002, 2, 151-154; Haubold, S.; Haase, M.; Kornowski, A.; Weller, H. *Chem Phys Chem*. 2001, 2, 331-334). The poor PL QY performance for these materials can be traced to the presence of phosphorus vacancies (Adam, S.; et al., *The Journal of Chemical Physics*. 2005, 123, 084706) ($V_P$) in the material.

The general synthetic approach for preparation of colloidal semiconductor nanoparticles employs a bulky reaction flask under continuous Ar flow with a heating mantle operating in excess of 240° C. The reaction is initiated by rapid injection of the precursors, which are the source materials for the nanoparticles, at high temperatures and growth is controlled by the addition of a strongly coordinating ligand to control kinetics. And to a more limited extent, domestic microwave ovens have been used to synthesize nanoparticles. The high temperature method imposes a limiting factor for industrial scalability and rapid nanomaterial discovery for several reasons: random batch-to-batch irregularities such as temperature ramping rates and thermal instability; time and cost required for preparation for each individual reaction; and low product yield for device applications.

While recent advances in the field have developed better reactants, including inorganic single source precursors, metal salts, and oxides; better passivants, such as amines and non-coordinating solvents; and better reaction technologies, such as thermal flow reactors; the reactions are still limited by reproducibility. Coupled to this problem is the lack of control over reaction times, which require continuous monitoring. In the case of III-V compound semiconductors, the synthetic pathways have rates of growth on the order of days, while in the case of II-VI's, size control is very difficult and depends on the ability to rapidly cool the reaction. In these cases, the reaction depends on heating rate, heat uniformity over the reaction vessel, stirring and rapid and uniform cool-down.

Removal of the surface $V_P$ sites by active ion etching with hydrofluoric acid (HF) improves the PL performance of these materials to ~40% (Gerbec, J.; et al., *Journal of American Chemistry Society*. 2005, 127, 15791; Adam, S.; et al., *The Journal of Chemical Physics*. 2005, 123, 084706; Micic, O.; Sprague, J.; Lu, Z. Nozik, A. *Appl. Phys. Letters*. 1996, 68, 3150-3152; Talapin, D.; Gaponik, N.; Borchert, H.; Rogach, A.; Haase, M.; Weller, H. *Journal of Physical Chemistry B*. 2002, 106, 12659-12663). While the use of active ion etching with HF enhances the InP nanocrystal PL, it represents an inconvenient extra synthetic step that lowers solubility, broadens the excitonic absorption line width, and increases the difficulty for ZnS shelling. The development of an in-situ active ion etchant can simplify the preparation of this family of material, improve the PL QY, and maintain the optical properties of the nanocrystal.

The use of ionic liquids in synthesis have attracted attention due to the high thermal stability of the solvent, non-reactivity of the materials, and the added benefit of the solvent being recyclable (Antonietti, M.; Kuang, D.; Smarsly, B.; Zhou, Y. *Angew. Chem. Int. Ed.* 2004, 43, 4988-4992). In an earlier report, our group demonstrated the advantages of using non-fluorinated ionic liquids in MW chemistry to accelerate growth of InP and CdSe nanocrystals (Gerbec, J.; et al., *Journal of American Chemistry Society.* 2005, 127, 15791). The isolated InP showed typical PL QYs for this family with values on the order of 4%. Following HF treatment the PL QY increases to 38% (Id.). The most notable effect of using an ionic liquid in MW chemistry is the efficient conversion of MW energy into thermal energy due to the high MW cross-section that ionic liquids possess. In MW chemistry, the molecule with the highest cross-section selectively absorbs the MW energy and through relaxation heats the solvent or the molecular precursors. The selective absorption leads to the "specific" microwave effects often quoted in the synthetic literature (Kappe, O. *Angew. Chem. Int. Ed.* 2004, 43, 6250-6284). Ionic liquids typically are not directly involved in the reaction mechanism and can be considered a spectator solvent, allowing non-absorbing materials to be rapidly heated in the MW by convective loss; although ILs are believed to enhance reactions due to the highly ordered solvent framework (Antonietti, M.; et al., *Angew. Chem. Int. Ed.* 2004, 43, 4988-4992; Redel, E.; Thomann, R.; Janiak, C. *Chem. Commun.* 2008, 1789-1791).

Nanocrystals, as well as the other systems, are rapidly finding applications in biological imaging, biomedical technologies, electronics and photovoltaics. However, current methods to remove materials defects, vacancy or add-ion removal requires annealing (long reaction time) or post reaction treatment with a highly dangerous (HF) solvent. The invention alleviated this shortcomings, allowing rapid isolation of materials and improved total yields.

SUMMARY OF THE INVENTION

The nanoparticles synthesized by the present invention may comprise semiconductor components. There is no limitation in their composition, but typical examples are single substances of Group IV elements, such as C, Si, Ge, or Sn, single substances of Group V elements, such as P (black phosphorus), single substances of Group VI elements, such as Se or Te, compounds of Group VI elements, such as SiC, and compound from multiple Groups, such as GeS, GeSe, GeTe, SnS, SnSe, SnTe, PbS, PbSe, PbTe, AlN, AlP, AlAs, AlSb, GaN, GaP GaAs, GaSb, InN, InP, InAs, InSb, GaS, GaSe, GaTe, InS, InSe, InTe, TlS, TlSe, TlTe, ZnS, ZnSe, ZnTe, CdS, CdSe, CdTe, HgS, HgSe, HgTe and their ternary and quaternary alloys. Other compounds envisioned are $As_2S_3$, $As_4S_4$, $As_2Se_3$, $As_2Te_3$, $Sb_2S_3$, $Sb_2Se_3$, $Sb_2Te_3$, $Bi_2S_3$, $Bi_2Se_3$, $Bi_2Te_3$, CuO, $Cu_2O$, $Ag_2S$ and CuSe, CuCl, AgBr and AuCl, $NiS_2$, PdS and PtSe, CoSe, RhS and IrSe, FeO, FeS, FeSe and RuS, MnO, MnS, MnSe and ReS, $Cr_2S_3$, $Cr_2Se_3$ and $MoS_2$, VS, VSe, and NbS, $TiO_2$, $TiS_2$, and $ZrS_2$, BeO, MgS, and CaSe, and chalcogen spinnels, barium titanates ($BaTiO_3$).

The invention provides a method to remove defects, vacancies and surface add-ions during the growth of spherical, oblate or elliptical nanocrystals (1-10 nm) by generating in-situ an active ion etchant (halides (F, Cl, Br), oxygen). The in-situ generation of the active ion is achieved by the selective absorption of microwave energy into an ionic liquid which induces decomposition of the active ion containing counter ion ($BF_4$, $PF_6$, F, $ClO_4$, $PO_4$, chlorides, bromides, acetate, hydroxide, etc), improving the out-of batch optical performance of nanocrystals.

The in-situ active ion etching process is achieved using a microwave- (MW) based synthetic protocol with a decomposable ionic liquid (IL). In-situ generation of the active ion is achieved through direct MW absorption by the IL, thermal relaxation to the counter-ion, and subsequent production of active ion resulting in phosphorus vacancy ($V_p$) removal during the growth of the nanocrystal. Choosing an ionic liquid containing an active anion that thermally degrades circumvents the requitiste HF etching step by directly producing an in-situ ion source. The concentration of active anion is controlled by the microwave power, microwave cross section, thermal decomposition rate of counter ion, and concentration of the ionic liquid in the reaction mixture of the IL and subsequent thermal degradation of the anion source.

Using this methodology, the active ion is available at low concentrations during the reaction and actively removes defects, vacancies, and add-ions from the growing nanocrystal surface. Defect removal improves the materials crystallinity, optical properties, and electrical properties for a wide range of group IV (Si, Ge), II-VI, II-V, III-V, and III-VI semiconductor systems. Without limiting the invention, Group II family members include Cd, Zn, Hg; Group III members Al, Ga, and In; Group V family compound members N, P, As, and Sb; and Group VI family members O, S, Se, and Te.

The photoluminescence quantum yield (PL QY) for InP grown under in-situ etching conditions is 47% for the additive hmim $BF_4$ at a mole ratio of 1:10 ($In^{3+}$ to IL). Time dependent degradation studies of the InP grown with the IL indicates the PL properties are maintained in solution for an extended time frame with no detectable change in PL QY after 24 h.

The in-situ, microwave assisted active ion etching method represents the first technique to produce high PL QY InP nanocrystals out of batch without using post-generation HF treatment or core-shelling. Additionally, it allows in-situ vacancy or defect removal during the chemical preparation of nanocrystals.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

InP nanocrystals are prepared using separate stock solutions of indium palmitate and tris-trimethylsilylphosphine [(TMS)$_3$P] in a CEM Discover Microwave reactor vessel. Solutions of indium palmitate and tris-trimethylsilylphosphine (TMS)$_3$P dissolved in decane were prepared at 50° C. under Argon. Predetermined concentrations of additive, listed in the Table, were added to the microwave reactor vessel. The indium palmitate and (TMS)$_3$P solutions were injected into the microwave reactor vessel at a molar ratio of 2:1. The solutions were mixed prior to MW irradiation. MW growth is accomplished by ramping the reaction at 300 W (single mode, focused, 2.45 GHz), with a ramping time from 1-25 minutes depending on the choice of additive or MW system used. Once the desired temperature of 280° C. was reached, the reaction vessel was actively cooled using pressurized air, from about 3 psi to 30 psi, of the microwave cavity to remove latent heat. The reaction was allowed to progress for a reaction time of 15 minutes. Once the MW reaction was complete, the temperature is rapidly reduced to room temperature (~2 min) using forced air cooling at approximately 70 psi.

Figure 1:
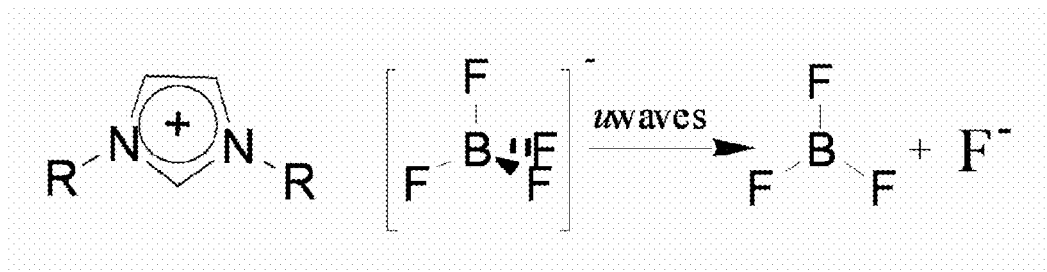
FIG. 1 depicts a Balz-Schiemann type reaction equation, forming the free fluoride ion.
Figure 2:
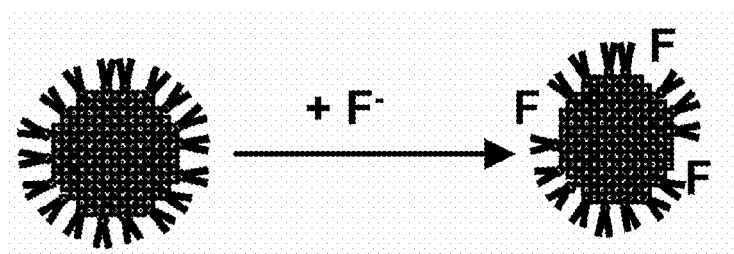
FIG. 2 depicts a diagrammatic illustration of fluoride etching of a nanoparticle's surface. As seen in the illustration, the fluoride inhabits the etched regions.

[PF$_6$]$^-$ and [BF$_4$]$^-$ anions are prone to thermal decomposition producing controlled quantities of F$^-$ ions. The thermal production of fluoride ions arises from a Balz-Schiemann type reaction, seen in FIG. 1. In fact, tetrafluoroborate-based ionic liquids thermally decompose at 240° C. at a rate of 0.017%/min. This results in the anionic fluoride radical etching the surface of the forming nanocrystal, seen in FIG. 2. In order to assess the affect on the PL QY of InP by the addition of fluorinated ILs during nanocrystal growth, a series of ILs were investigated, based on 1-hexyl-3-methyl-imidazolium (hmim), 1-butyl-4-methyl-pyridinium (bmpy), and tetrabutylammonium (TBA) with the counter-ions [BF$_4$]$^-$, [PF$_6$]$^-$, F$^-$, and Cl$^-$.

TABLE 1

Additives used in InP Synthesis

| Anion | Additive | Abbreviation | Ratio | PL QY | Ramp Time (sec) |
|---|---|---|---|---|---|
| [BF$_4$]$^-$ | 1-hexyl-3-methyl-imidazolium BF$_4$ | hmim BF$_4$ | 1:20 | 35.3 | 55 |
| | | hmim BF$_4$ | 1:10 | 47.1 | 70 |
| | | hmim BF$_4$ | 1:5 | 41.6 | 225 |
| | | hmim BF$_4$ | 1:3 | 34.6 | 410 |
| | | hmim BF$_4$ | 1:2 | 8.8 | 340 |
| | | hmim BF$_4$ | 1:1 | 1.7 | 760 |
| | | hmim BF$_4$ | 1:0.1 | 1.2 | 810 |
| | 1-butyl-4-methyl-pyridinium BF$_4$ | bmpy BF$_4$ | 1:20 | 29.5 | 180 |
| | | bmpy BF$_4$ | 1:10 | 43.2 | 220 |
| | | bmpy BF$_4$ | 1:5 | 9.9 | 250 |
| | | bmpy BF$_4$ | 1:3 | 2.7 | 325 |
| | | bmpy BF$_4$ | 1:2 | 3.8 | 435 |
| | | bmpy BF$_4$ | 1:1 | 1.6 | 590 |
| | | bmpy BF$_4$ | 1:0.1 | 1.3 | 1320 |
| | tetrabutylammonium BF$_4$ | TBA BF$_4$ | 1:10 | 11.2 | 170 |
| | | TBA BF$_4$ | 1:1 | 4.2 | 370 |
| | | TBA BF$_4$ | 1:0.1 | 1 | 1735 |
| [PF$_6$]$^-$ | 1-hexyl-3-methyl-imidazolium PF$_6$ | hmim PF$_6$ | 1:10 | 24.5 | 150 |
| | | hmim PF$_6$ | 1:1 | 5.7 | 310 |
| | | hmim PF$_6$ | 1:0.1 | 1.8 | 485 |
| | 1-butyl-4-methyl-pyridinium PF$_6$ | bmpy PF$_6$ | 1:10 | N/A | 220 |
| | | bmpy PF$_6$ | 1:1 | 1.8 | 302 |
| | | bmpy PF$_6$ | 1:0.1 | 1 | 485 |
| | tetrabutylammonium PF$_6$ | TBA PF$_6$ | 1:10 | N/A | 305 |
| | | TBA PF$_6$ | 1:1 | 1 | 432 |
| | | TBA PF$_6$ | 1:0.1 | 1 | 1065 |
| F$^-$ | tetrabutylammonium fluoride | TBA F | 1:10 | N/A | 190 |
| | | TBA F | 1:1 | N/A | 295 |
| | | TBA F | 1:0.1 | 1 | 720 |
| Cl$^-$ | 1-hexyl-3-methyl-imidazolium Cl | hmim Cl | 1:10 | N/A | 135 |
| | | hmim Cl | 1:1 | N/A | 430 |
| | | hmim Cl | 1:0.1 | 2.3 | 670 |
| | 1-butyl-4-methyl-pyridinium Cl | bmpy Cl | 1:10 | N/A | 140 |
| | | bmpy Cl | 1:1 | N/A | 494 |
| | | bmpy Cl | 1:0.1 | 1.5 | 1332 |

For the optical studies, the InP nanocrystals were isolated from the reaction mixture by initial addition of toluene and precipitation by addition of acetone, followed by treatment with toluene/MeOH (2×). The quantum yields were determined by comparing the emission of InP with that from rhodamine 6G in ethanol (QY=95%). (Gerbec, J.; et al., *Journal of American Chemistry Society.* 2005, 127, 15791).

Figure 3:
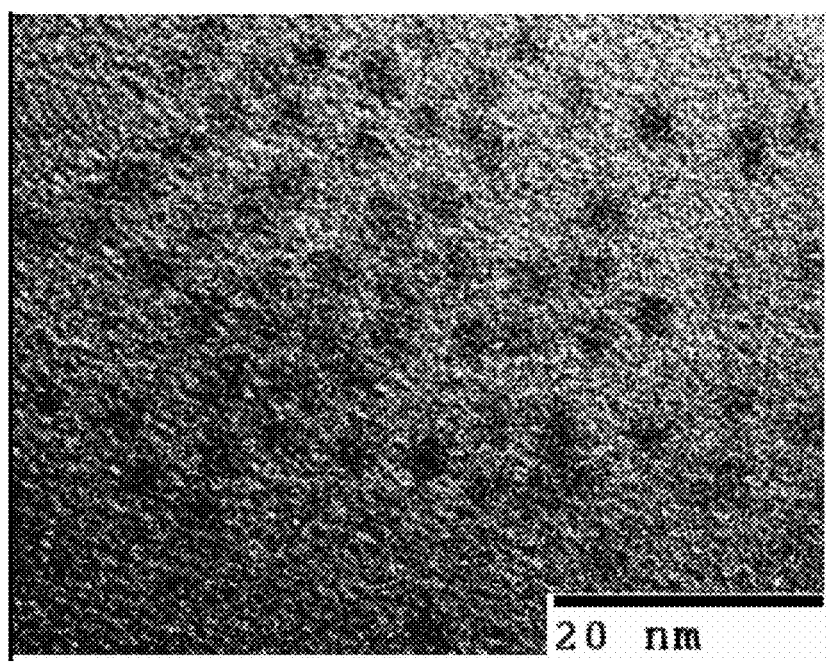
FIG. 3 depicts a TEM image of grown InP with hmim $BF_4$.
Figure 4:
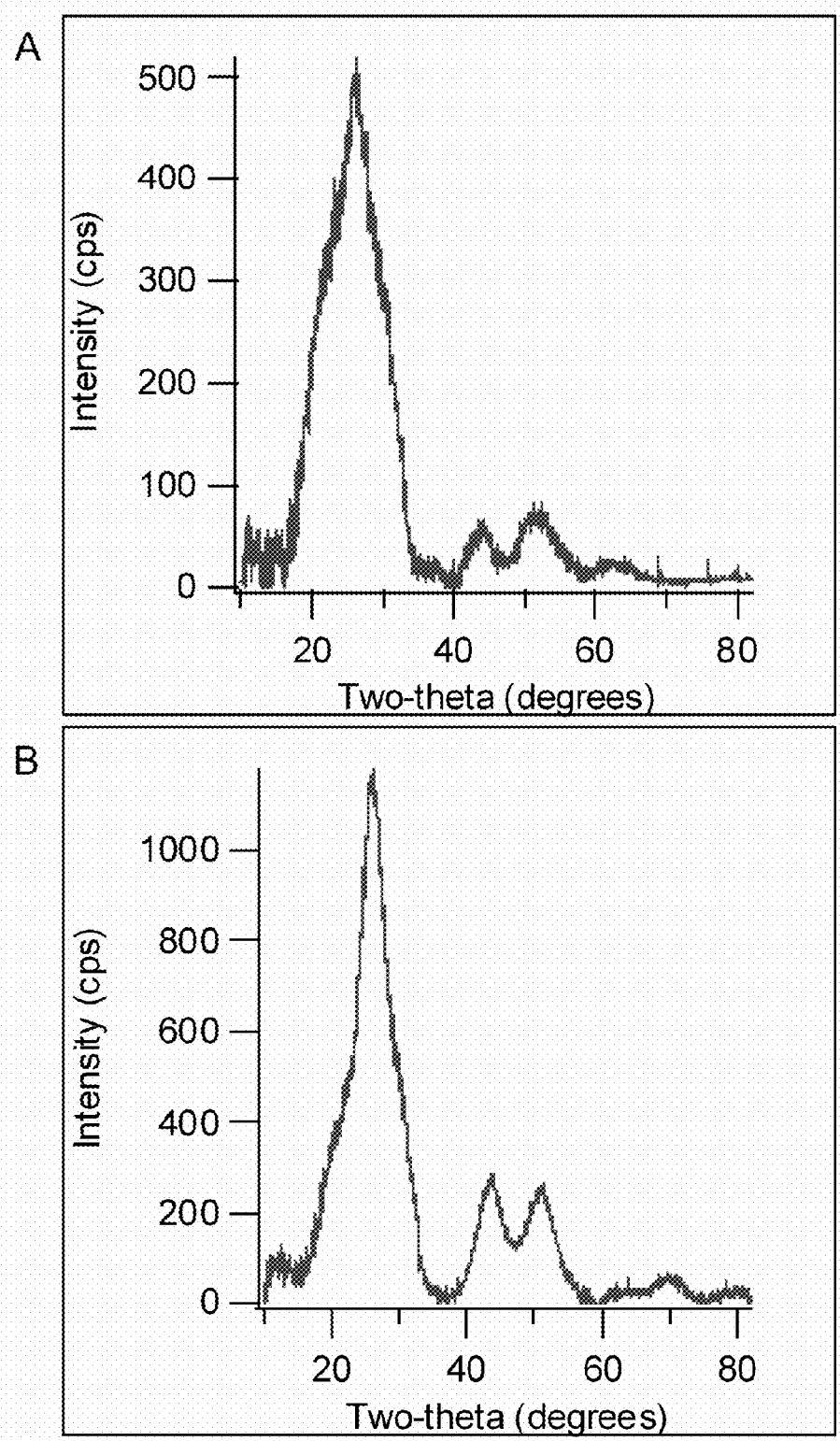
FIGS. 4(a) and (b) depict graphs of pXRD results for InP grown with a 1:10 mole ratio of A) bmpy $BF_4$ and B) InP grown with hmim $BF_4$.
Figure 5:
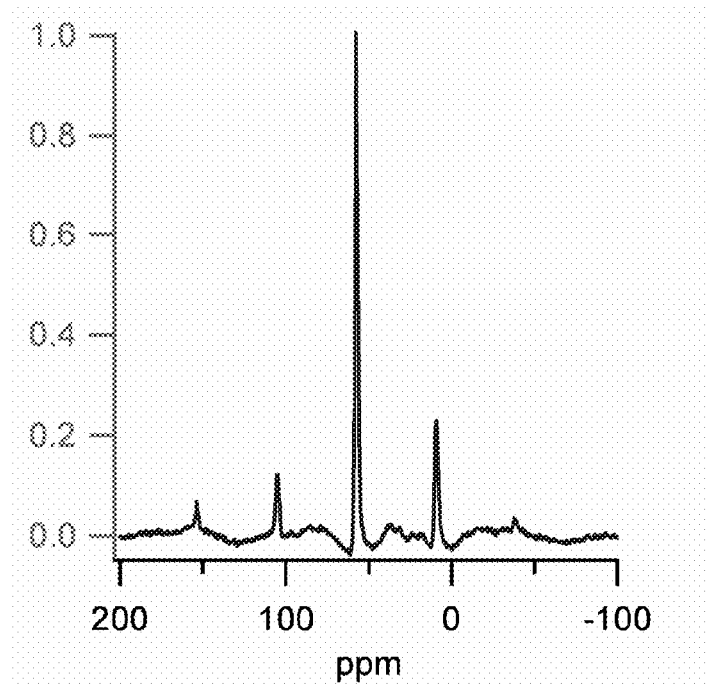
FIG. 5 depicts a $^{19}F$ MAS graph of InP grown with bmpy $BF_4$ (1:10 mole ratio), performed at room temperature on a Varian Unity/Inova 500 MHz spectrometer with a 2.5-mm broadband MAS probe tuned to $^{19}F$ (470.32 MHz). A spinning speed of 22 kHz, an acquisition time of 10 msec, recycling delay of 3 sec, and a contact time of 7 μsec was used.

Using transmission electron microscopy (TEM), the MW-grown InP are 2.7±0.3 nm spherical, cubic morphology nanocrystals, seen in FIG. 3. The large disparity represents an upper limit due to imaging limitations for these materials at this size regime. Powder X-ray diffraction (pXRD) analysis of the sample indicates a Zn-blende structure (F-43m) is formed, as seen in FIG. 4. Scherrer analysis of the pXRD confirms the TEM size measurement. Solid state nuclear magnetic resonance spectroscopy shows that fluorine is still present after material isolation on the InP samples grown by these methods, seen in FIG. 5, indicating that InP has been HF etched.

Figure 6:
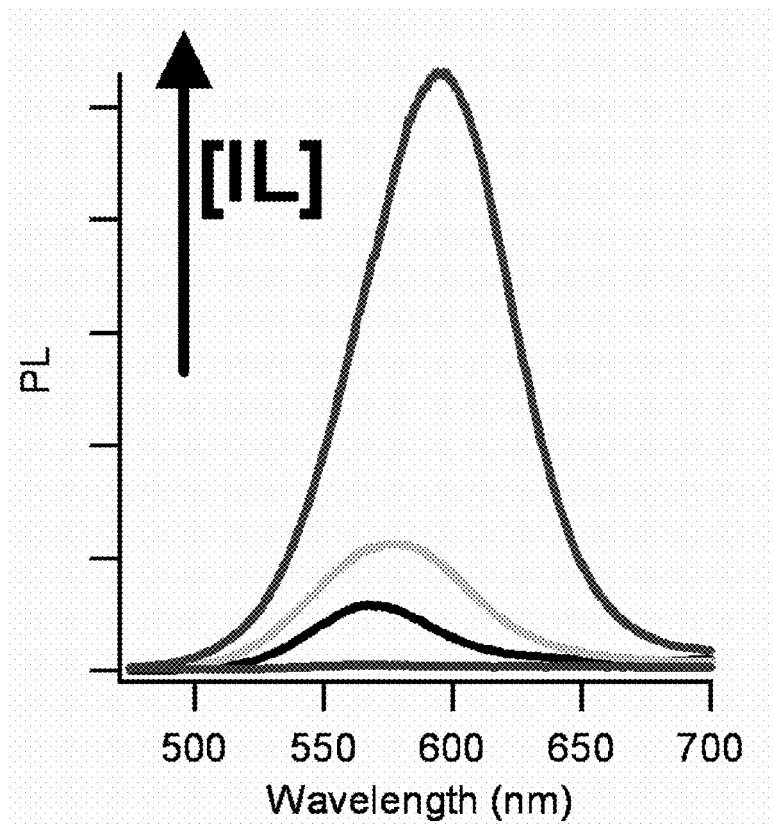
FIG. 6 is a graph depicting the effect of the concentration of an ionic liquid on nanocrystal photoluminescence. Concentration ratios of the IL used are no ionic liquid (lower dark gray trace), 1:2 (black), 1:5 (light gray), and 1:10 (upper dark gray trace).
Figure 7:
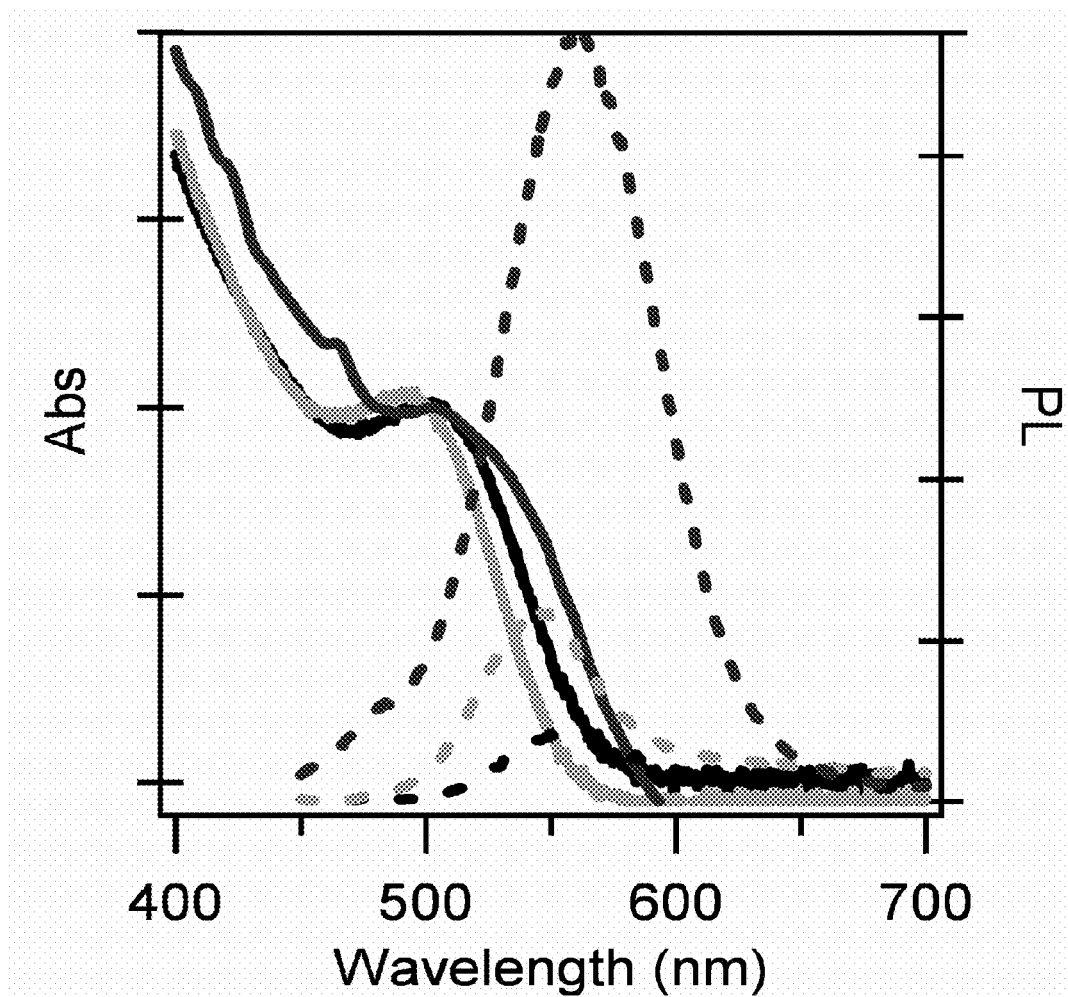
FIG. 7 depicts a graph comparing Abs and PL of InP grown with hmim $BF_4$. Concentrations of the $In^{3+}$ precursor to the IL used are 1:0.1 (black), 1:1 (light gray), and 1:10 (dark gray).
Figure 8:
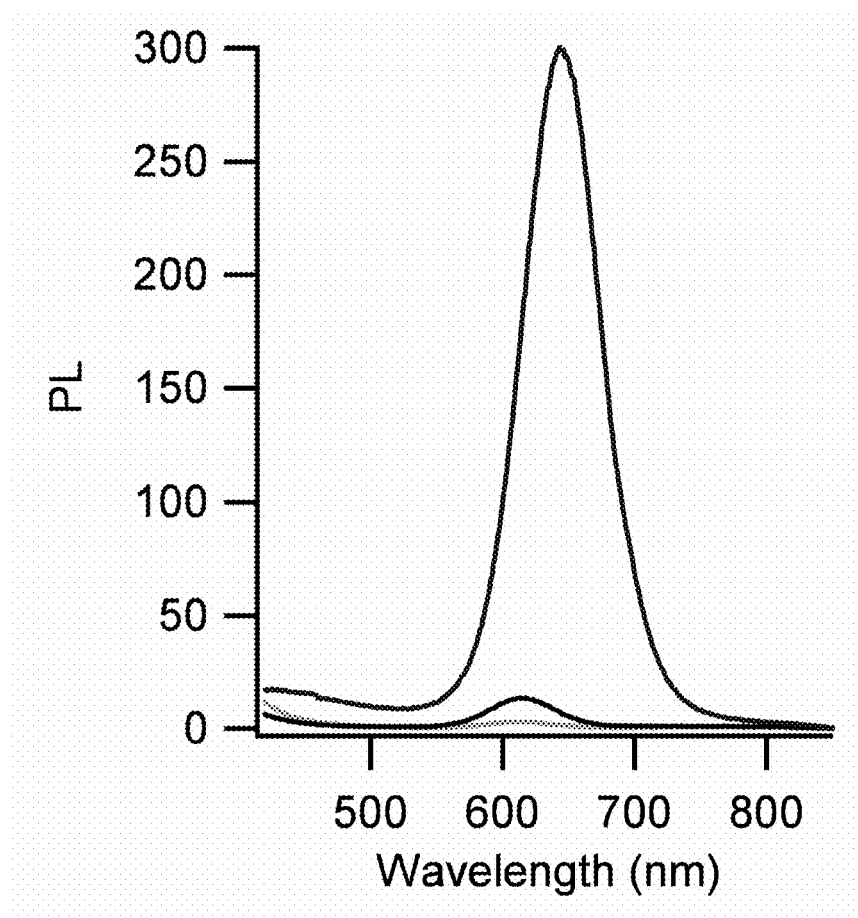
FIG. 8 depicts a graph comparing the concentration dependence of PL for InP grown from bmpy $BF_4$ at a 1:0.1 (light gray), 1:1 (black), 1:10 (dark gray).
Figure 9:
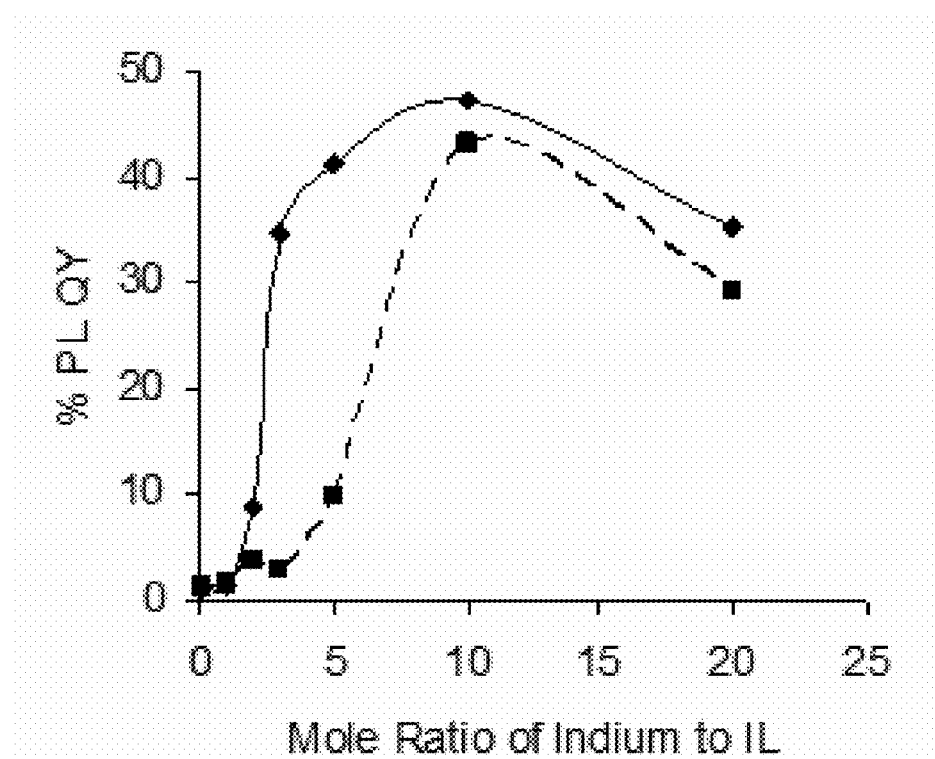
FIG. 9 PL QY for a series of In$^{3+}$: IL mole ratios of InP grown with hmim BF$_4$ (solid) and InP grown with bmpy BF$_4$ (dash).

The magnitude of enhancement resulting from adding hmim BF$_4$ to the MW reactor is clearly evidenced in the dramatic PL improvement observed for the InP nanocrystal grown in the presence and absence of the IL, seen in FIG. 6 and data not shown. The changes in the absorption and PL spectra for InP grown with the additive added in a 1:0.1, 1:1, and 1:10 mole ratio of In$^{3+}$ to hmim BF$_4$ are shown in FIG. 7. The PL QYs for each additive condition are compiled in the Table. The [BF$_4$]$^-$ salts showed the highest overall PL QY improvement, followed by the [PF$_6$]$^-$ based ILs lower QYs, while the F$^-$ and Cl$^-$ salts did not produce highly emissive materials or led to loss of the nanocrystal. The highest PL QY arises for the ionic liquid hmim BF$_4$ at a concentration of 1:10. At this concentration it was possible to reproducibly grow InP with a PL QY of 47%. No spectral shift for the PL profile is observed for the various concentrations of hmim BF$_4$, seen in FIG. 7, or bmpy BF$_4$, as seen in FIG. 8; however as the concentration of IL is increased the InP PL QY asymptotes for the hmim BF$_4$ at a concentration above 1:5, while bmpy BF$_4$ asymptotes at 1:10, seen in FIG. 9. The difference in hmim and bmpy can be explained due to the higher polarity of hmim, and therefore higher MW absorption and subsequent thermal transfer from the IL to the counterion. (Aki, S., et al., *Chem. Commun.* 2001, 413-414) The higher thermal transfer leads to higher fluoride ion release in the reaction.

Figure 10:
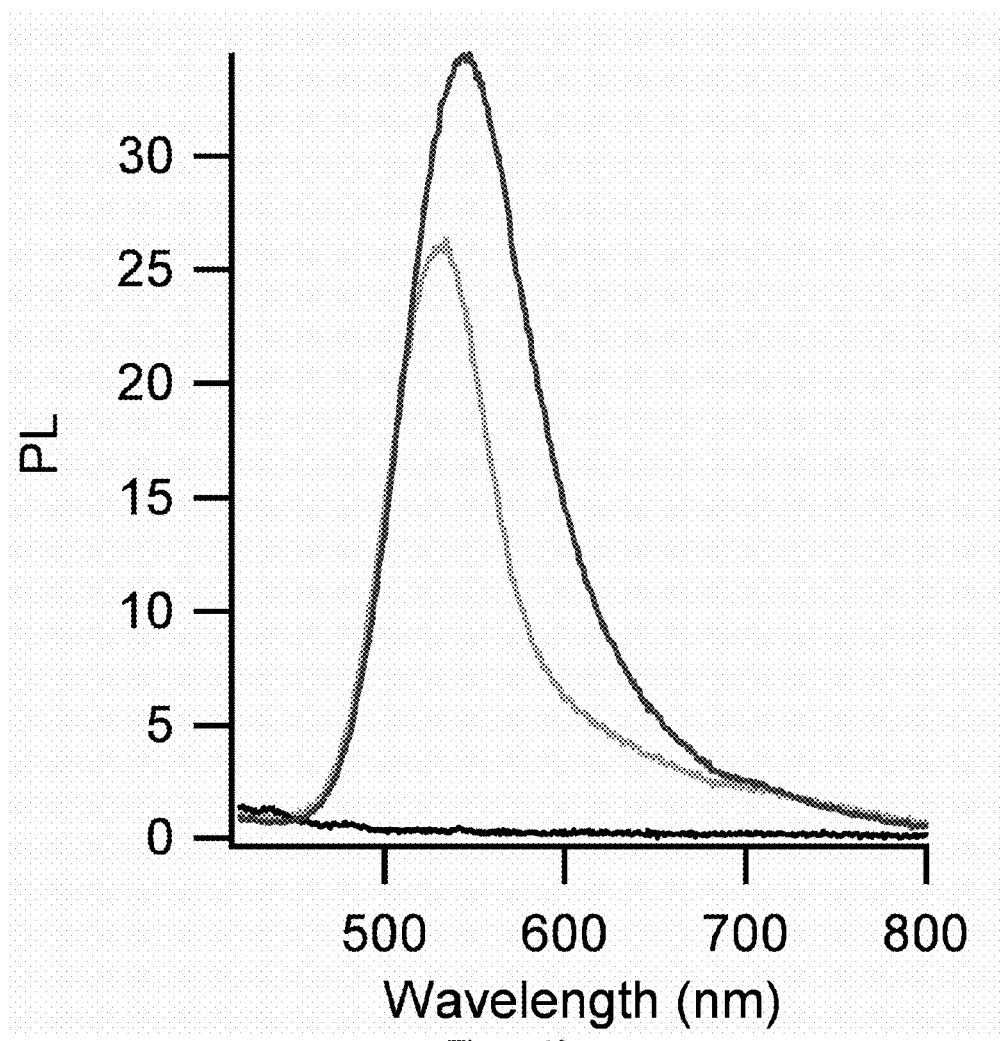
FIG. 10 Comparison of PL properties for InP grown with a 1:1 mole ratio of hmim PF$_6$ (dark gray), hmim BF$_4$ (light gray), and hmim Cl (black).

The observed InP PL QY depends on the type of IL and the concentration of IL. For samples grown with a 1:10 mole ratio of the IL the trend observed is BF$_4^-$>BF$_6^-$>>>Cl$^-$, while at a 1:1 ratio the PL QY follows the trend $PF_6^- > BF_4^- >>> Cl^-$, seen in FIG. 10. The observed anion dependence on IL mole ratio reflects the magnitude of $F^-$ production, with $[PF_6]^-$ having the highest fluoride ion production in time compared to $[BF_4]^-$. The level of fluoride ion production mirrors the bond energies for the B—F bond (174 kcal/mol) compared to the P—F bond (96 kcal/mol) (Lide, D., CRC Handbook of Chemistry and Physics. 88th Ed. 2007-2008). The weaker bond strength in P—F will result in more facile thermal degradation and therefore higher fluoride ion concentrations. At high IL mole ratios the increased fluoride ion concentration leads to aggressive etching and subsequent loss of the materials.

To assess whether the PL improvement requires an IL with a high MW cross section or just an anion capable of producing fluoride ion, TBA salts of $[BF_4]^-$, $[PF_6]^-$, and $F^-$ were tested at reaction temperatures of 280° C., which is high enough to initiate anion degradation. The Table illustrates the combination of IL and counter-ion necessary to achieve high PL QY in these materials. Although PL QY improvement is observed for TBA $BF_4$, the PL QY for TBA $BF_4$ was far lower (11%) than observed for either hmim $BF_4$ (47%) or bmpy $BF_4$ (43%). For the TBA salts, the magnitude of PL QY followed the trend $[BF_4]^- >>> [PF_6]^- \sim F^-$. At high concentrations of the $[PF_6]^-$ or $F^-$ salts the InP nanocrystals are not formed. As noted earlier, it is believed that for the $[PF_6]^-$ and $F^-$ salts, more rapid fluoride generation exists in the reaction and the resultant $F^-$ ions inhibit InP growth due to formation of $InF_3$ and reaction with the P source with subsequent formation of $PF_3$. The difference in PL QY between TBA and hmim can be explained due to the lower microwave absorption by TBA during the reaction resulting in lower $F^-$ production for the ILs during the InP growth. The lower MW cross section for TBA is clearly evidenced by the longer MW ramp times observed for the TBA salts, seen in the Table.

The experimental results suggest that a slow, controlled production of fluoride ions during nanocrystal growth is crucial to produce the highest PL QY in InP. The slow production of fluoride ions apparently allows controlled removal of defects to compete with nanocrystal growth. At high fluoride ion concentrations ($[PF_6]^-$ vs. $[BF]^-$), the rate of etching is faster than the rate of growth resulting in poor material performance. At low fluoride ion content (hmim $BF_4$ vs. bmpy $BF_4$) the reaction results in faster growth than etching, which yields poor PL QYs. The balance of etching and growth imply that during synthesis of InP nanocrystals an ionic liquid with a fluoride counter ion serves to super-heat the reaction through the high absorption cross section for microwave energy of the IL converting that energy to convective energy, and produce a transient in-situ source for fluoride ions by thermal degradation of the counter-ion. MW chemistry allows the careful control of etching relative to growth by balancing the MW cross section of the reactants with the thermal degradation rate for the fluoride containing IL. The careful control provided by the MW leads to a rapid, convenient synthetic methodology allowing isolation of InP nanocrystals with nearly 50% PL QYs that are adaptable to a flow through technology. Such a technology allows the use of these materials in bio-imaging applications where toxicity issues are a concern for bio-nanotechnology.

It is also to be understood that the following claims are intended to cover all of the generic and specific features of the invention herein described, and all statements of the scope of the invention which, as a matter of language, might be said to fall therebetween.

What is claimed is:

1. A method of producing nanoparticles exhibiting enhanced photoluminescence quantum yield comprising the steps of:
   providing stock solutions of Group III-VI elements;
   providing an ionic liquid containing an anion that thermally degrades to form an ion etchant, wherein the anion is $BF_4$, $PF_6$, F, $ClO_4$, $PO_4$, chloride, bromide, acetate, or hydroxide;
   wherein the mole ratio of stock solutions of Group III-VI elements to ion etchant is 1:0.1, 1:1, or 1:10;
   placing the ionic liquid into a microwave reactor vessel;
   dissolving the stock solutions of Group III-VI elements in a solute and injecting the resulting solution into the microwave reactor vessel;
   subjecting the solutions in the microwave reactor vessel to microwave irradiation, wherein the microwave irradiation degrades the anion of the ionic liquid into an etchant;
   where the etchant is $F^-$, $Cl^-$, $Br^-$, or $O^-$;
   allowing the stock solutions of Group III-VI elements to form nanoparticles, wherein the nanoparticles are etched in situ by the etchant during nanoparticle growth; and
   collecting the resulting nanoparticles.

2. The method of claim 1, wherein the microwave irradiation is ramped at 300 W.

3. The method of claim 1, further comprising ramping the reaction between 1 minute and 25 minutes.

4. The method of claim 1, wherein the ionic liquid comprises 1-hexyl-3-methyl-imidazolium, 1-butyl-4-methyl-pyridinium, tetrabutylammonium, or their derivatives.

5. The method of claim 4, wherein the ionic liquid is used at a molar concentration ratio between 1:1 and 1:10, stock solutions of Group III-VI elements to ionic liquid.

6. The method of claim 1, wherein the resulting nanoparticles are collected by using at least one compound selected from the group consisting of toluene, acetone, and methanol.

7. The method of claim 1, further comprising the step of cooling the reaction site after formation of the nanoparticles using forced air cooling.

8. The method of claim 1, wherein stock solutions of Group III-VI elements are indium, indium palmitate, tris-trimethylsilylphosphine, gallium, nitrogen phosphorus, arsenic, or antimony; and
   the stock solutions of Group III-VI elements cadmium, zinc, seleium, tellurium, sulfur, or oxygen.

9. The method of claim 8, wherein stock solutions of Group III-VI elements consist of indium palmitate and tris-trimethylsilylphosphine.

10. The method of claim 1, wherein the nanoparticles consist of GeS, GeSe, GeTe, SnS, SnSe, SnTe, PbS, PbSe, PbTe, MN, AlP, AlAs, AlSb, GaN, GaP GaAs, GaSb, InN, InP, InAs, InSb, GaS, GaSe, GaTe, InS, InSe, InTe, TlS, TlSe, TlTe, ZnS, ZnSe, ZnTe, CdS, CdSe, CdTe, HgS, HgSe, HgTe, $As_2S_3$, $As_4S_4$, $As_2Se_3$, $As_2Te_3$, $Sb_2S_3$, $Sb_2Se_3$, $Sb_2Te_3$, $Bi_2S_3$, $Bi_2Se_3$, $Bi_2Te_3$, CuO, $Cu_2O$, $Ag_2S$, CuSe, CuCl, AgBr, AuCl, $NiS_2$, PdS, PtSe, CoSe, RhS, IrSe, FeO, FeS, FeSe, RuS, MnO, MnS, MnSe, ReS, $Cr_2S_3$, $Cr_2Se_3$, $MoS_2$, VS, VSe, NbS, $TiO_2$, $TiS_2$, $ZrS_2$, BeO, MgS, CaSe, or $BaTiO_3$.

11. A method of etching nanoparticles comprising the steps of:
   providing stock solutions of Group III-VI elements;
   providing an ionic liquid containing an anion that thermally degrades to form an ion etchant, wherein the anion is $BF_4$ $PF_6$, F, $ClO_4$, $PO_4$, chloride, bromide, acetate, or hydroxide;

wherein the mole ratio of stock solutions of Group III-VI elements to ion etchant is 1:0.1, 1:1, or 1:10;

placing the ionic liquid into a microwave reactor vessel;

dissolving the stock solutions of Group III-VI elements in a solute and injecting the resulting solution into the microwave reactor vessel;

subjecting the solutions in the microwave reactor vessel to microwave irradiation, wherein the microwave irradiation degrades the anion of the ionic liquid into an etchant;

where the etchant is $F^-$, $Cl^-$, $Br^-$, or $O^-$;

allowing the stock solutions of Group III-VI elements to form nanoparticles, wherein the nanoparticles are etched in situ by the etchant; and collecting the resulting nanoparticles.

12. The method of claim 11, wherein the microwave irradiation is ramped at 300 W.

13. The method of claim 11, further comprising ramping the reaction between 1 minute and 25 minutes.

14. The method of claim 11, wherein the ionic liquid comprises 1-hexyl-3-methyl-imidazolium, 1-butyl-4-methyl-pyridinium, tetrabutylammonium, or their derivatives.

15. The method of claim 11, wherein the ionic liquid is used at a molar concentration ratio between 1:1 and 1:10, stock solutions of Group III-VI elements to ionic liquid.

16. The method of claim 11, wherein the resulting nanoparticles are collected by using at least one compound selected from the group consisting of toluene, acetone, and methanol.

17. The method of claim 11, further comprising the step of cooling the reaction site after reaction completion using forced air cooling.

18. The method of claim 11, wherein stock solutions of Group III-VI elements are compounds selected from the group consisting of indium, gallium, nitrogen phosphorus, arsenic, indium palmitate, tris-trimethylsilylphosphine, and antimony; and wherein the stock solutions of Group III-VI elements are cadmium, zinc, seleium, tellurium, sulfur, or oxygen.

19. The method of claim 18, wherein stock solutions of Group III-VI elements further consist of indium palmitate and tris-trimethylsilylphosphine.

20. The method of claim 11, wherein the nanoparticles consist of GeS, GeSe, GeTe, SnS, SnSe, SnTe, PbS, PbSe, PbTe, AlN, AlP, AlAs, AlSb, GaN, GaP GaAs, GaSb, InN, InP, InAs, InSb, GaS, GaSe, GaTe, InS, InSe, InTe, TlS, TlSe, TlTe, ZnS, ZnSe, ZnTe, CdS, CdSe, CdTe, HgS, HgSe, HgTe, $As_2S_3$, $As_4S_4$, $As_2Se_3$, $As_2Te_3$, $Sb_2S_3$, $Sb_2Se_3$, $Sb_2Te_3$, $Bi_2S_3$, $Bi_2Se_3$, $Bi_2Te_3$, CuO, $Cu_2O$, $Ag_2S$, CuSe, CuCl, AgBr, AuCl, $NiS_2$, PdS, PtSe, CoSe, RhS, IrSe, FeO, FeS, FeSe, RuS, MnO, MnS, MnSe, ReS, $Cr_2S_3$, $Cr_2Se_3$, $MoS_2$, VS, VSe, NbS, $TiO_2$, $TiS_2$, $ZrS_2$, BeO, MgS, CaSe, or $BaTiO_3$.

* * * * *